US008084361B2

(12) United States Patent
Huang et al.

(10) Patent No.: US 8,084,361 B2
(45) Date of Patent: Dec. 27, 2011

(54) SEMICONDUCTOR FABRICATION METHOD SUITABLE FOR MEMS

(75) Inventors: Tsung-Cheng Huang, Jhubei (TW); Hua-Shu Wu, Hsinchu (TW); Fa-Yuan Chang, Taipei (TW); I-Ching Lin, Taipei (TW); Hsi-Lung Lee, Jhudong Township (TW); Yuan-Hao Chien, Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 979 days.

(21) Appl. No.: 11/755,437

(22) Filed: May 30, 2007

(65) Prior Publication Data

US 2008/0299769 A1 Dec. 4, 2008

(51) Int. Cl.
*H01L 21/3213* (2006.01)

(52) U.S. Cl. ..... 438/692; 438/21; 438/694; 257/E21.23; 257/E21.496

(58) Field of Classification Search ........... 438/21, 438/692, 694; 257/E21.23, E21.496
See application file for complete search history.

(56) References Cited

U.S. PATENT DOCUMENTS

| | | | |
|---|---|---|---|
| 6,627,467 B2 * | 9/2003 | Haluzak et al. | 438/21 |
| 7,041,566 B2 * | 5/2006 | Pyo | 438/381 |
| 7,109,118 B2 * | 9/2006 | Cohen et al. | 438/697 |
| 7,169,539 B2 * | 1/2007 | Lim et al. | 430/320 |
| 7,172,917 B2 * | 2/2007 | Partridge et al. | 438/50 |
| 7,285,226 B2 * | 10/2007 | Bengali | 216/27 |
| 7,300,596 B2 * | 11/2007 | Murayama et al. | 216/27 |
| 7,429,495 B2 * | 9/2008 | Wan | 438/53 |
| 7,465,403 B2 * | 12/2008 | Kim et al. | 216/27 |
| 7,736,929 B1 * | 6/2010 | Monadgemi et al. | 438/51 |
| 2004/0012653 A1 * | 1/2004 | Trueba et al. | 347/63 |
| 2005/0032362 A1 * | 2/2005 | Cohen et al. | 438/658 |
| 2006/0028510 A1 * | 2/2006 | Park et al. | 347/63 |
| 2007/0256301 A1 * | 11/2007 | Park et al. | 29/890.1 |
| 2008/0148567 A1 * | 6/2008 | Park et al. | 29/890.1 |
| 2008/0299769 A1 * | 12/2008 | Huang et al. | 438/669 |
| 2009/0169190 A1 * | 7/2009 | Fang et al. | 392/485 |

* cited by examiner

*Primary Examiner* — Mary Wilczewski
(74) *Attorney, Agent, or Firm* — Duane Morris LLP; Steven E. Koffs

(57) ABSTRACT

A method includes depositing a layer of a sacrificial material in a first region above a substrate. The first region of the substrate is separate from a second region of the substrate, where a corrosion resistant film is to be provided above the second region. The corrosion resistant film is deposited, so that a first portion of the corrosion resistant film is above the sacrificial material in the first region, and a second portion of the corrosion resistant film is above the second region. The first portion of the corrosion resistant film is removed by chemical mechanical polishing. The sacrificial material is removed from the first region using an etching process that selectively etches the sacrificial material, but not the corrosion resistant film.

20 Claims, 5 Drawing Sheets

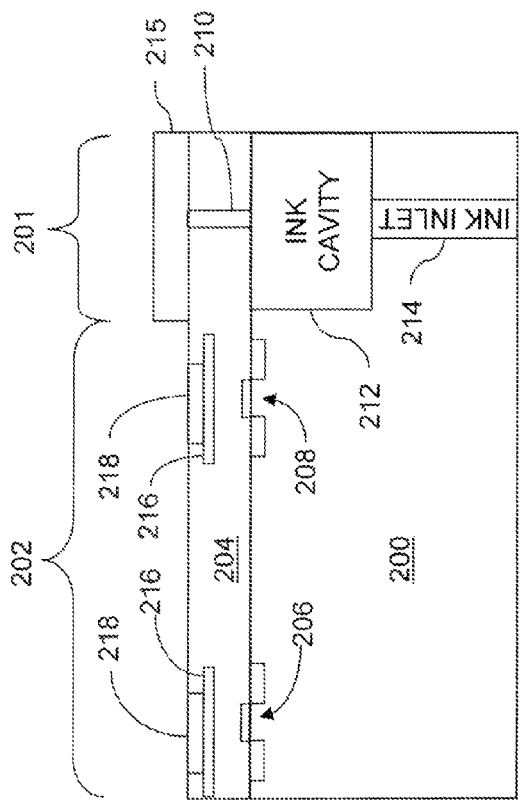
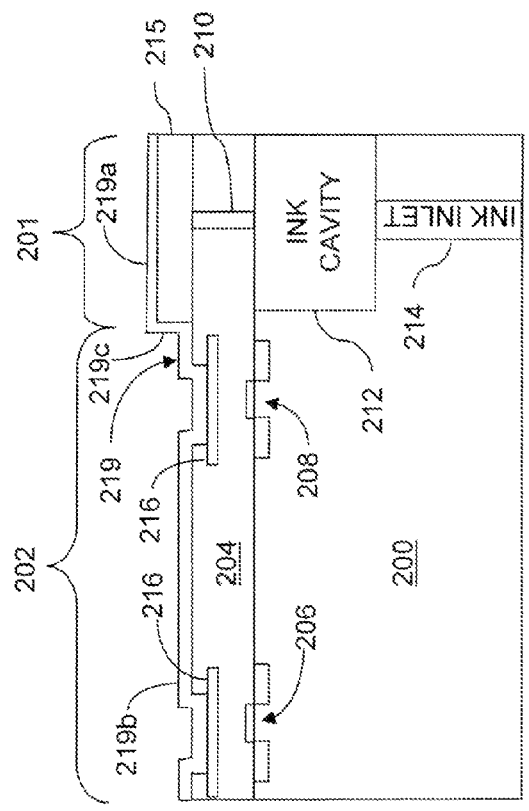
FIG. 2A
FIG. 2B

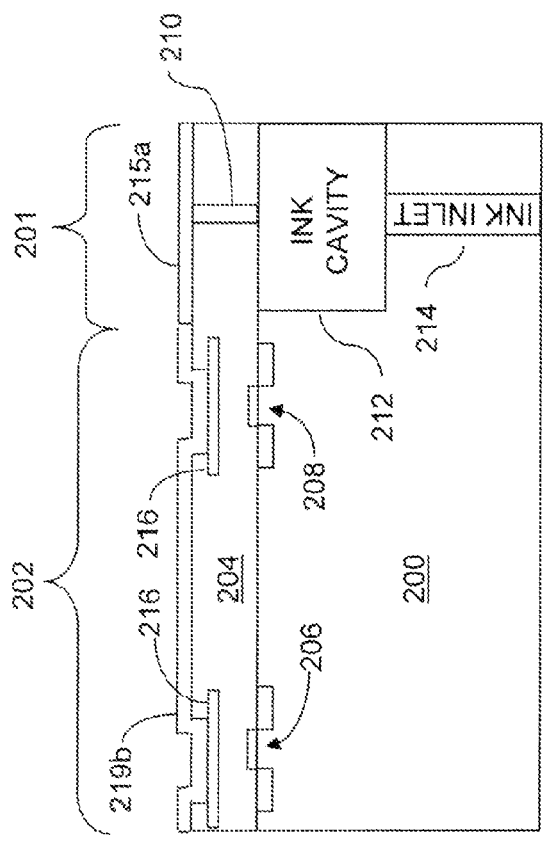
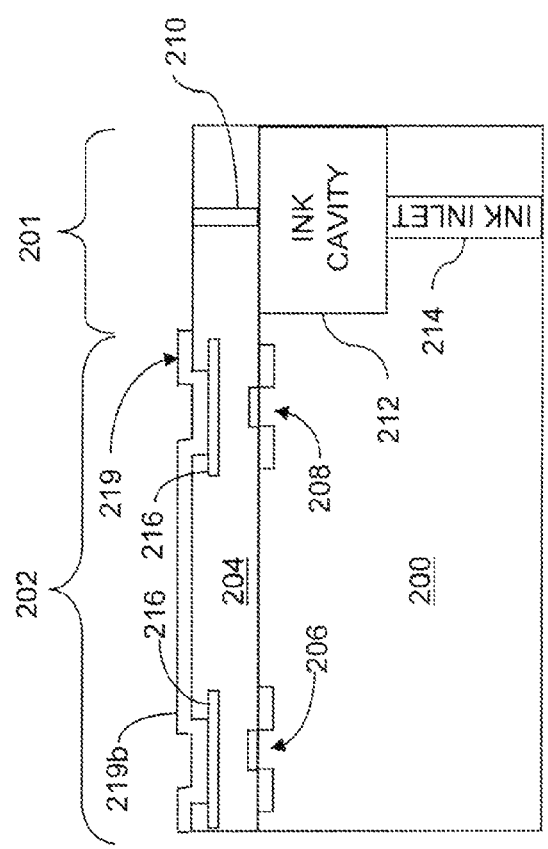
FIG. 2C
FIG. 2D

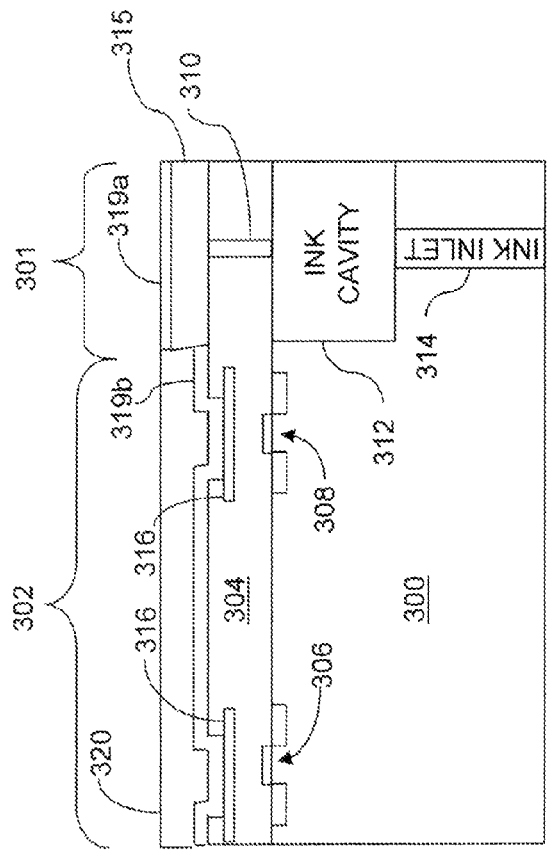
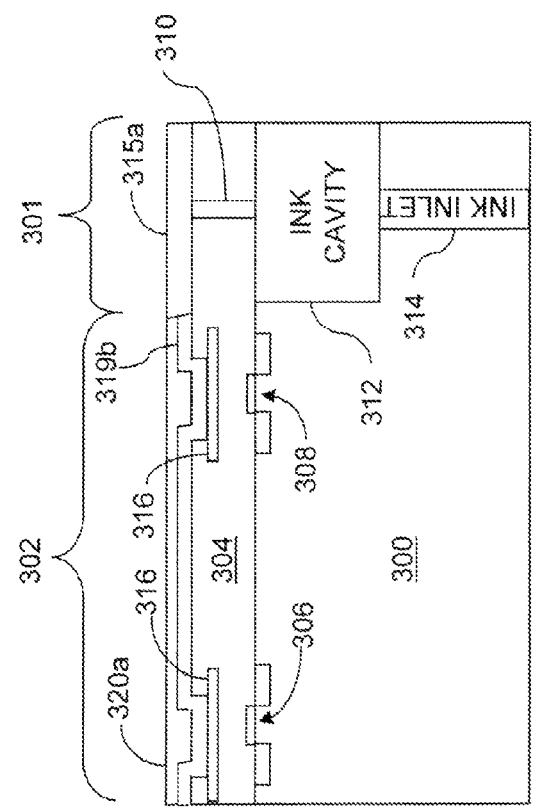
FIG. 3A
FIG. 3B

US 8,084,361 B2

SEMICONDUCTOR FABRICATION METHOD SUITABLE FOR MEMS

FIELD OF THE INVENTION

The present invention relates to semiconductor fabrication generally, and more particularly to methods suitable for use in fabrication of micro-electromechanical systems (MEMS).

BACKGROUND

Micro-Electro-Mechanical Systems (MEMS) refer to the integration of mechanical elements and electronics on a semiconductor substrate through microfabrication technology. While the electronics are fabricated using integrated circuit (IC) processes, the micromechanical elements are fabricated using compatible "micromachining" processes that selectively etch away parts of the silicon wafer to form the mechanical and electromechanical devices.

MEMS have been fabricated using modified versions of the same semiconductor fabrication technology used to make electronics (e.g., CMOS). These include: molding and plating, wet etching (potassium hydroxide (KOH), or Tetra-Methyl Ammonium Hydroxide (TMAH)) and dry etching (reactive ion etching (RIE) and deep reactive ion etching (DRIE)), electro discharge machining (EDM), and other technologies capable of manufacturing very small devices.

For some MEMS devices, the material used for conventional fabrication processes can be plasma etched, but has poor mechanical properties and a short lifetime. It would be desirable to use a material with good mechanical properties and corrosion resistance, to improve the MEMS life time. However, if the material that is selected for fabricating the MEMS is corrosion resistant, the material would also be resistant to dry etching by typical plasma, or wet etching by a wet bench process.

Improved MEMS fabrication techniques are desired.

SUMMARY OF THE INVENTION

In some embodiments, a method comprises depositing a layer of a sacrificial material in a first region above a substrate. The first region of the substrate is separate from a second region of the substrate, where a corrosion resistant film is to be provided above the second region. The corrosion resistant film is deposited, so that a first portion of the corrosion resistant film is above the sacrificial material in the first region, and a second portion of the corrosion resistant film is above the second region. The first portion of the corrosion resistant film is removed by chemical mechanical polishing. The sacrificial material is removed from the first region using an etching process that selectively etches the sacrificial material, but not the corrosion resistant film.

In some embodiments, a method comprises depositing a layer of a sacrificial material above a micro-electromechanical system (MEMS) in a first region of a substrate. A film is deposited. The film has a first portion above the MEMS and a second portion above a second region of the substrate. The film comprises a material that is resistant to etching by a first etching process. The first portion of the film is removed by chemical mechanical polishing. The sacrificial material is removed from the first region using the first etching process.

BRIEF DESCRIPTION OF THE DRAWINGS

FIGS. 2A to 2D show an exemplary fabrication sequence for a MEMS.
FIGS. 3A to 3B show a variation of the fabrication sequence of FIGS. 2A-2D.

DETAILED DESCRIPTION

Figure 1:
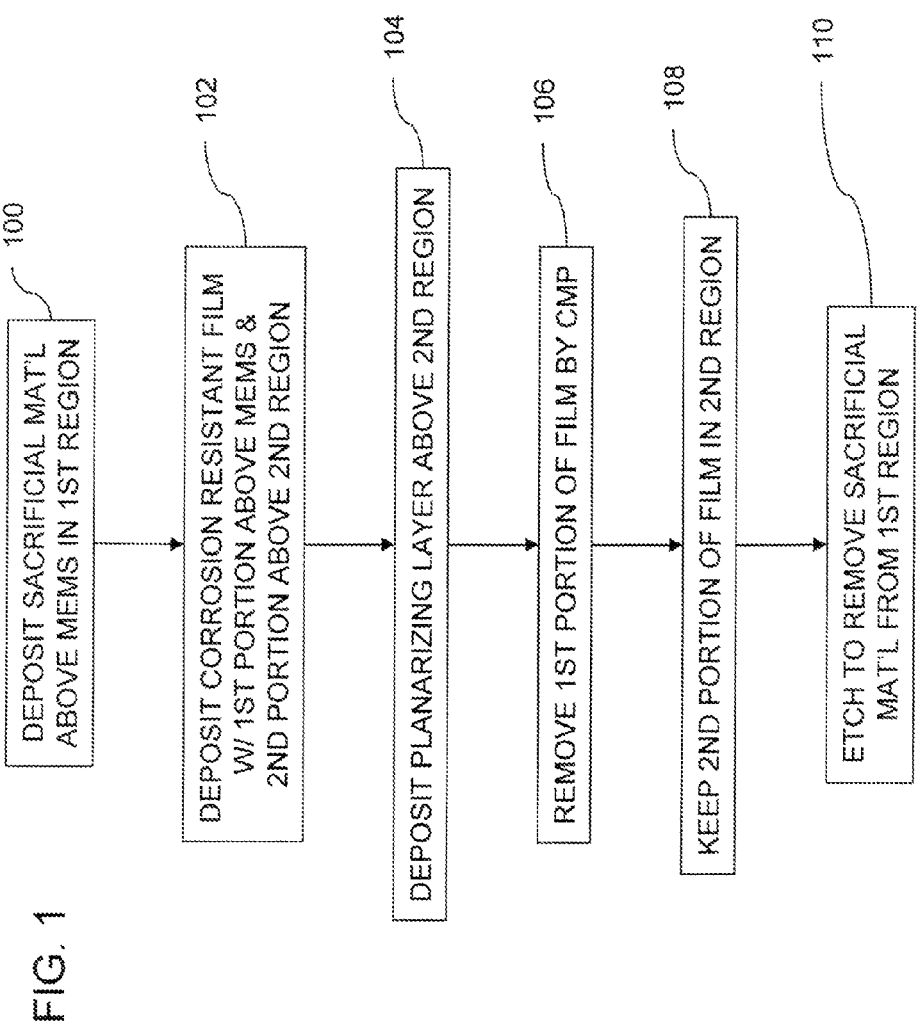
FIG. 1 is a flow chart of an exemplary method.

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation.

FIG. 1 is a flow chart of an exemplary method. FIGS. 2A-2D show an example of the structure formed by the method of FIG. 1, at various steps of the process.

Referring to FIGS. 1 and 2A, at step 100, a layer of a sacrificial material 215 is deposited in a first region 201 above a substrate 200. The first region 201 is separate from a second region 202 of the substrate 200, where a corrosion resistant film is to be provided above the second region.

In some embodiments, the substrate 200 comprises a MEMS device in the first region 201. In other embodiments, the substrate 200 comprises a MEMS device in the second region 202. In other embodiments, the substrate 200 comprises a first MEMS device in the first region 201 and a second MEMS device in the second region 202. Additionally, either or both of the first and second regions may contain one or more integrated circuit components.

FIGS. 2A-2D are cross sectional views showing an exemplary structure formed by the process, wherein the first region 201 of the substrate 200 includes a microelectromechanical system (MEMS). In the example of FIGS. 2A-2D, the MEMS is an inkjet nozzle 210, fed by an ink cavity 212 connected to an ink inlet 214; and the second region 202 of the substrate 200 comprises a heater 219 (FIGS. 2B-2D) for the inkjet nozzle 210.

FIG. 2A shows the structure at the conclusion of step 100. In FIG. 2A, a substrate 200 has a plurality of devices 206, 208 formed in the active layer thereof. The devices 206, 208 may include transistors, diodes, capacitors or the like. The devices 206, 208 may be formed by any integrated circuit fabrication processes. An interconnect structure 204 having a plurality of interconnect or inter-metal dielectric (IMD) layers (not shown individually) is provided above the substrate. For example, the interconnect layers may comprise inter-metal dielectric layers, each having metal and inter-metal via layers therein. The interconnect structure includes conductors 216, which will provide power to the heater 219 in operation. One or more openings 218 are provided, extending from the surface to the conductors 216.

Also shown in FIG. 2A is the sacrificial material 215 deposited in the first region 201. The sacrificial material 215 has a thickness that is greater than or equal to the thickness of the corrosion resistant material 219 (FIG. 2B) to be deposited above the substrate.

The substrate may be a silicon substrate, a III-V compound substrate, a silicon/germanium (SiGe) substrate, a silicon-on-insulator (SOI) substrate, a display substrate such as a liquid crystal display (LCD), a plasma display, an electro luminescence (EL) lamp display, or a light emitting diode (LED) substrate, for example.

In some embodiments, the sacrificial material 215 may be a photoresist. For example, in a reverse tone process using a negative photoresist as a sacrificial material, a mask (not shown) having a pattern in the second region 202 may be used to deposit the sacrificial material 215 (negative photoresist) in the first region 201. The negative photoresist may be based on epoxy-based polymers, such as SU-8 photoresist.

In some embodiments, the sacrificial layer 215 may comprise a layer including a silicon oxide, a polymer (such as polypropylene glycol (PPG), polybutadine (PB), polyethylene glycol (PEG) and polycaprolactonediol (PCL)), fluorinated amorphous carbon (a-FiC), silicon gel, organic silaxone, porogen low-k dielectric material, or other material that may decompose and/or vaporize by a thermal treatment at a temperature between about 250° C. and about 450° C., by UV treatment, or combinations thereof. The sacrificial layer 215 may be formed by, for example, a spin-on process, a chemical vapor deposition (CVD) process or combinations thereof. The thickness of the sacrificial layer should be greater than a thickness of the film of corrosion-resistant material to be deposited.

Referring to FIGS. 1 and 2B, at step 102, the corrosion resistant film 219 (FIG. 2B) is deposited above the substrate 200, so that a first portion 219a of the corrosion resistant film is above the sacrificial material 215 in the first region 201, and a second portion 219b of the corrosion resistant film is above the second region 202.

In some embodiments, the corrosion resistant material 219 may be "INCONEL® alloy 625" sold by HP Alloys of Tipton, Ind. This material contains Ni, Cr, Mo, Nb+Ta, and provides high strength and toughness to 1800 degrees F. (980 degrees C.), good oxidation resistance, exceptional fatigue strength, and good corrosion resistance.

Other suitable corrosion resistant materials include nickel and one or more of the following constituents: chromium, iron, molybdenum, niobium, tantalum copper, aluminum, and/or titanium. In some embodiments, the corrosion resistant material may include, but is not limited to: "HASTELLOY® alloy C-276," "HASTELLOY® alloy B-2," "FERRALIUM® alloy 255," "NITRONIC® 60 (Alloy 218)," "NITRONIC® 50," "CARPENTER® alloy 20Cb-3®," "HASTELLOY® alloy C-22®," "Alloy 59," "Nickel 200/201," "MONEL® alloy 400," "MONEL® alloy R-405," "MONEL® alloy K-500," "INCONEL® alloy 600," or :NITRONIC® 30," all of which are available from HP Alloys of Tipton, Ind.

At step 104 of FIG. 1, a planarizing layer 320 (described below with reference to FIG. 3A) may be deposited above the second region. Preferably, the planarizing layer is made of the same material as the sacrificial material. In some embodiments, the planarizing layer covers both of the first and second regions. In other embodiments, the height of the planarizing layer is about the same as the height of the corrosion resistant material in the first region, and only covers the second region.

Referring now to FIGS. 1 and 2C, at step 106, the first portion 219a of the corrosion resistant film 219 (the portion above the sacrificial material 215) is removed by chemical mechanical polishing (CMP), so as to expose the sacrificial material 215a in the first region 201. In some embodiments, the step of removing the first portion 219a of the film 219 by chemical mechanical polishing includes removing part of the layer of sacrificial material 215. In the example of FIG. 2C, the CMP step removes material until the remaining thickness of the sacrificial material 215 is about the same as the thickness of the corrosion resistant material 219, so that the vertical segment 219c (shown in FIG. 2B) of the corrosion resistant material is completely removed.

In other embodiments, the CMP step may be designed to only remove the corrosion resistant film (and possibly a minimal amount of the sacrificial material) in the first region, in which case the CMP step may have a shorter duration.

At step 108 of FIG. 1, as shown in FIG. 2C, the second portion 219b of the corrosion resistant film 219 in the second region 202 is kept. With the thickness of the sacrificial material 215 greater than or equal to the thickness of the corrosion resistant film 219, the corrosion resistant material 219a in the first region 201 is entirely above the corrosion resistant material 219b in the second region 202. Thus, the CMP step can remove the corrosion resistant material 219a from the first region 201 without removing the corrosion resistant material 219b from the second region 202.

Referring now to FIGS. 1 and 2D, at step 110, the remaining sacrificial material 215a is removed from the first region 201 using an etching process that selectively etches the sacrificial material 215, but not the corrosion resistant film 219b. Either a dry etch process (such as a reactive ion etch (RIE) or a wet bench process may be used. If a planarizing layer 320 (FIG. 3A) of the same sacrificial material has been placed over the second region 202, then the etching process also removes the portion of the planarizing layer 320 from the second region 202.

The resulting structure shown in FIG. 2D has a structure (heater 219b) formed thereon from a corrosion resistant material that would be difficult to etch using a typical dry or wet etch process. Further, it is possible to fabricate the heater 219b (or other structure) with a critical dimension (CD) that is smaller than a size (about 10 μm) that could be obtained by using a positive photoresist to etch the pattern directly in the corrosion material by a lift-off method. For example, a critical dimension as small as 1 μm may be obtained.

FIGS. 3A and 3B show a variation of the structure formed in FIGS. 2B and 2C. Items in FIG. 3A are labeled with reference numerals having the same two least significant digits as corresponding structure in FIG. 2B, increased by 100. These include substrate 300, first region 301, second region 302, IMD 304, devices 306, 308, inkjet nozzle 310, ink cavity 312, ink inlet 314, sacrificial material 315, conductors 316, and corrosion resistant material 319. The processing steps for the substrate 300 in FIGS. 3A and 3B can be the same as shown in FIG. 1. The substrate 300, after deposition of the sacrificial material 315, but before deposition of the film 319, appears similar to that shown in FIG. 2A, except that the sacrificial material has an anti-tapered profile (shown in FIG. 3A).

As shown in FIG. 3A, the sacrificial material 315 may be formed with an anti-tapered profile. This may be accomplished by depositing a layer of the sacrificial material 315 above the substrate 300 and removing the sacrificial material from the second region 302 using isotropic (e.g., wet) etching. By forming an anti-tapered profile in sacrificial material 315, the corrosion resistant material 319 is not formed on the anti-tapered side wall. That is, there is no vertical segment of corrosion resistant material corresponding to structure 219c in FIG. 2B.

FIG. 3A also shows a planarizing layer 320, as mentioned above with reference to step 104 of FIG. 1. Preferably, the planarizing layer 320 is formed from the same material as the sacrificial material 315, but other materials that can be removed by the same etching techniques applied to sacrificial material 315 may be used. The planarizing layer 320 can have a height that is greater than or equal to the height of the corrosion resistant material 319a in the first region. FIG. 3A shows the planarizing layer 320 with the same height as corrosion resistant material 319a; planarizing layer 320 is only deposited in the second region 302 of the substrate.

FIG. 3B shows the substrate 300 after the CMP step 106 of FIG. 1. The CMP step in FIG. 3B removes at least sufficient material to reduce the height of the remaining sacrificial material 315a by the thickness of the corrosion resistant film 319a. Preferably, the CMP step also removes between about one third and about two thirds of the sacrificial material 315.

By choosing a suitably large thickness of the sacrificial material 315 in the first region 301 of the substrate, and designing the CMP step to partially remove the sacrificial material 315, the precision of the CMP step does not have to be tightly controlled. For example, the CMP step may be designed to remove the first portion 319a of the corrosion resistant film 319 and about one half of the thickness of the sacrificial material 315 in the first region 301. A small deviation in the amount of sacrificial material removed by the CMP step would not effect the complete removal of the corrosion resistant material 319a from the first region 301 or cause inadvertent removal of the corrosion resistant material 319b from the second region 302.

Also, by designing the CMP step to leave part 320a of the planarizing layer 320, the corrosion resistant material 319b is protected during the CMP step.

Once the CMP step is completed, the remaining sacrificial material 312a and the remaining planarizing layer material 320a can be removed by wet etching, in the same manner described above with reference to FIG. 2D. After removing the remaining sacrificial material and planarizing layer material in step 110, the structure of FIG. 4 is substantially as shown in FIG. 2D.

In other embodiments (shown in FIG. 4), the height of the planarizing layer 420 is above the height of the corrosion resistant material 419a, and the planarizing layer 420 covers both the first region 401 and second region 402 of the substrate 400. A portion 420a of the planarizing layer 420 extends over the first region 401

Figure 4:
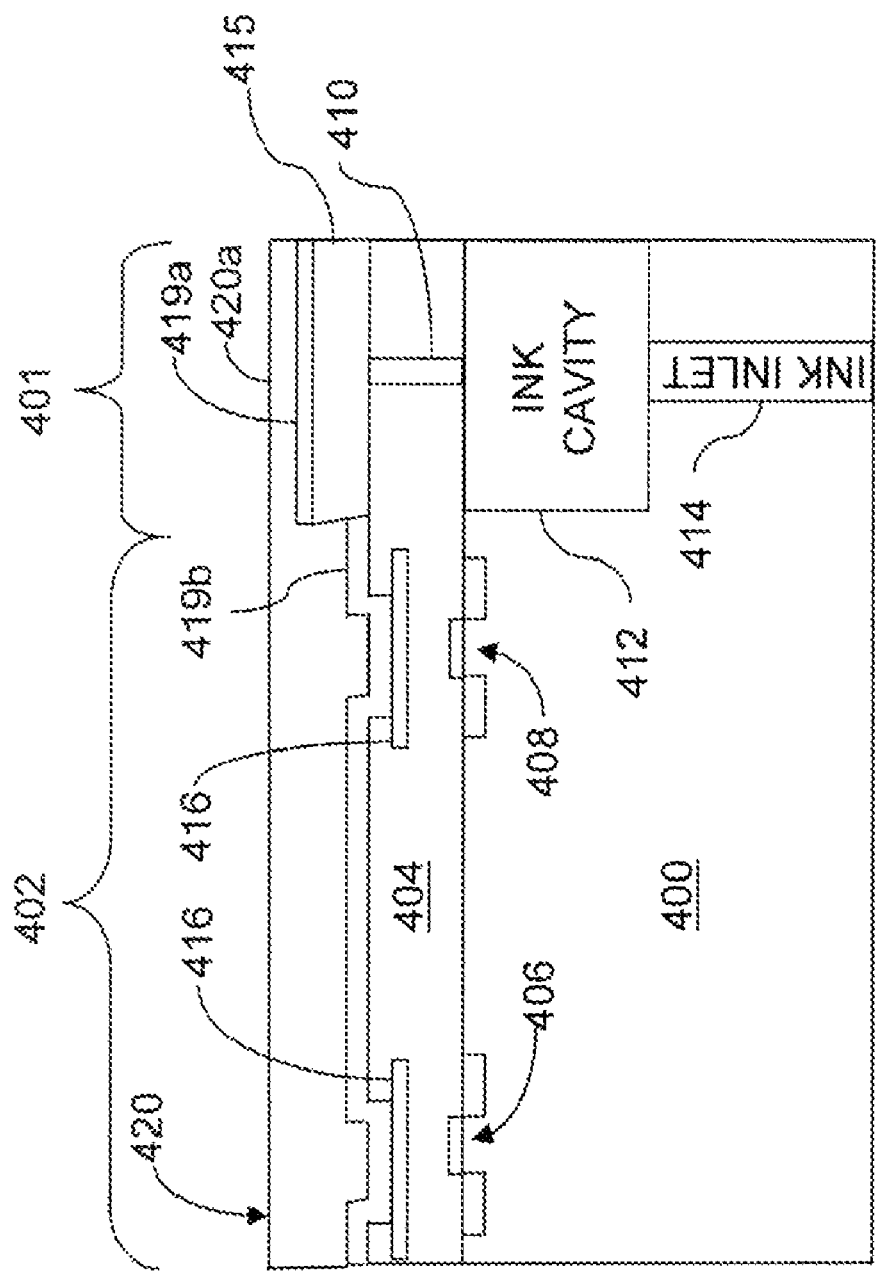
FIG. 4 shows a variation of the structure shown in FIG. 3A.

FIG. 4 shows a variation of the structure formed in FIG. 3A. Items in FIG. 4 are labeled with reference numerals having the same two least significant digits as corresponding structure in FIG. 3A, increased by 100. These include substrate 400, first region 401, second region 402, IMD 404, devices 406, 408, inkjet nozzle 410, ink cavity 412, ink inlet 414, sacrificial material 415, conductors 416, and corrosion resistant material 419. The processing steps for the substrate 400 in FIG. 4 can be the same as shown in FIG. 1. The substrate 400, after deposition of the sacrificial material 415, but before deposition of the film 419, appears similar to that shown in FIG. 2A, except that the sacrificial material has an anti-tapered profile (shown in FIG. 4). After removing the remaining sacrificial material and planarizing layer material in step 110, the structure of FIG. 4 is substantially as shown in FIG. 2D.

With a thicker planarizing layer 420, the thickness of the planarizing layer does not have to be tightly controlled to match the height of the planarizing layer to the height of the corrosion resistant material 419a in the first region.

Thus, methods are described above to use CMP to define a pattern for an anti-corrosion material which cannot be readily plasma-etched. These methods are able to define a pattern on a non-plasma-etched material with smaller CD than lift-off methods can achieve. These methods further allow use of CMP to define a pattern on a non-plasma-etched material, in which the pattern of material can be out of the plane in which MEMS processes are generally required.

Although examples are described above, in which a structure is formed to include a pattern of a corrosion resistant material, all of the techniques described above may also be used in other configurations in which a pattern of a material is to be applied, but it is not practical to pattern the material with available wet or dry etch processes. The procedure for applying a pattern of any difficult-to-etch material would be the same as described above for a corrosion-resistant material. It will be understood by one of ordinary skill in the art that "difficult-to-etch" materials include those for which the etching time or power are considered excessive, and could potentially damage the fabrication chamber, as well as materials for which the etch rate is so slow that it would result in a substantial increase in fabrication costs.

Although examples are described above in which either or both of the first and second regions contain a MEMS, the techniques described herein may be applied to integrated circuits that do not include MEMS. For example, the techniques described herein may be applied wherever they may improve or simplify manufacturability, such as any situation in which a pattern of a material is to be applied that has a smaller critical dimension (CD) than can be provided using a lift-off method. In any situation in which the reverse tone pattern in the sacrificial material can be controlled more accurately, or with smaller CD, than a positive pattern in the corrosion-resistant or etch-resistant material, the techniques described herein improve manufacturability.

Although examples are shown in the figures in which the corrosion-resistant or etch-resistant material is deposited at the top metal layer, the same techniques may be applied to form a pattern below the top metal layer, such as between or below the IMD layers.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A method, comprising the steps of:
   depositing a layer of a sacrificial material above a substrate in a first region of the substrate, separate from a second region of the substrate, wherein the first region of the substrate includes an inkjet nozzle, and a corrosion resistant film is to be provided above the second region;
   depositing the corrosion resistant film over the sacrificial material and the second region simultaneously, so that a first portion of the corrosion resistant film overlies the sacrificial material in the first region, and a second portion of the corrosion resistant film overlies the second region;
   removing the first portion of the corrosion resistant film by chemical mechanical polishing, so that the second portion of the corrosion resistant film forms a heater for the inkjet nozzle; and
   removing the sacrificial material from the first region using an etching process that selectively etches the sacrificial material, but not the corrosion resistant film.

2. The method of claim 1, further comprising keeping the second portion of the film in the second region.

3. The method of claim 1, further comprising depositing a planarizing layer above the second portion of the film before removing the first portion of the film.

4. The method of claim 1, wherein the step of removing the first portion of the film by chemical mechanical polishing includes removing part of the layer of sacrificial material.

5. The method of claim 1, wherein the layer depositing step includes depositing the sacrificial material by a reverse tone process, so that the sacrificial material is deposited outside of a pattern comprising the first portion of the film.

6. The method of claim 1, wherein the film comprises a nickel alloy.

7. The method of claim 1, wherein the sacrificial material is a photoresist.

8. The method of claim 1, wherein the inkjet nozzle is a microelectromechanical system (MEMS).

9. The method of claim 1, wherein the sacrificial material has an anti-tapered profile that is wider at a top thereof, relatively further from the substrate, than at a bottom thereof, relatively closer to the substrate.

10. The method of claim 1, wherein the depositing step includes depositing the first portion of the corrosion resistant film directly on the sacrificial material in the first region.

11. The method of claim 1, wherein the step of removing the sacrificial material exposes a top surface of the substrate, and a top surface of the corrosion resistant material is above a top surface of the substrate.

12. A method, comprising the steps of:
depositing a layer of a sacrificial material above substrate in a a first region of the substrate, wherein the first region of the substrate includes an inkjet nozzle, and;
depositing a film over the sacrificial material and a second region of the substrate simultaneously, so that, a first portion of the film overlies the sacrificial material and a second portion of the film overlies a second region of the substrate, the film comprising a material that is resistant to etching by a first etching process;
removing the first portion of the film by chemical mechanical polishing, so that the second portion of the film includes a heater for the inkjet nozzle; and
removing the sacrificial material from the first region using the first etching process.

13. The method of claim 12, wherein the step of removing the sacrificial material exposes a top surface of the substrate, and a top surface of the film is above a top surface of the substrate.

14. A method, comprising the steps of:
(a) depositing a layer of a sacrificial material above a substrate in a first region of the substrate, the sacrificial material having an anti-tapered profile that is wider at a top thereof than at a bottom thereof;
(b) depositing a film over the sacrificial material and a second region of the substrate, so that a first portion of the film overlies the sacrificial material and a second portion of the film overlies a second region of the substrate, the film comprising a material that is resistant to etching by a first etching process;
(c) depositing a planarizing layer having at least a first portion overlying the second portion of the film;
(d) performing chemical mechanical polishing so as to remove the first portion of the film and partially remove the first portion of the planarizing layer; and
(e) performing the first etching process so as to remove the sacrificial material and a remaining portion of the planarizing layer from the second region.

15. The method of claim 14, wherein the first region of the substrate includes a micro electromechanical system (MEMS), and the sacrificial material is deposited above the MEMS.

16. The method of claim 14, wherein the step of removing the first portion of the film by chemical mechanical polishing includes forming a pattern having a smaller critical dimension than can be formed by the first etching process.

17. The method of claim 14, wherein the layer depositing step includes depositing the sacrificial material by a reverse tone process, so that the sacrificial material is deposited outside of a pattern comprising the first portion of the film.

18. The method of claim 14, wherein:
step (c) includes depositing a second portion of the planarizing layer overlying the first portion of the film, and
step (d) includes removing the second portion of the planarizing layer.

19. The method of claim 18, wherein the planarizing layer is made from the same material as the sacrificial material layer.

20. The method of claim 14, wherein step (b) includes depositing the film over the sacrificial material and the second region of the substrate, such that a portion of a side surface of the sacrificial material having the anti-tapered profile does not have the film deposited thereon.

* * * * *